(12) United States Patent
Yu et al.

(10) Patent No.: US 11,646,274 B2
(45) Date of Patent: May 9, 2023

(54) MULTI-PACKAGE ASSEMBLIES HAVING FOAM STRUCTURES FOR WARPAGE CONTROL

(71) Applicant: Intel Corporation, Santa Clara, CA (US)

(72) Inventors: Mufei Yu, Chandler, AZ (US); Gang Duan, Chandler, AZ (US); Edvin Cetegen, Chandler, AZ (US); Baris Bicen, Chandler, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 16/444,615

(22) Filed: Jun. 18, 2019

(65) Prior Publication Data
US 2020/0402920 A1 Dec. 24, 2020

(51) Int. Cl.
*H01L 23/00* (2006.01)
*H01L 23/522* (2006.01)

(52) U.S. Cl.
CPC ........ *H01L 23/562* (2013.01); *H01L 23/5226* (2013.01); *H01L 24/09* (2013.01); *H01L 2924/3511* (2013.01)

(58) Field of Classification Search
CPC .............. H01L 23/562; H01L 23/5226; H01L 23/5389; H01L 23/5383; H01L 23/3121; H01L 23/28; H01L 24/09; H01L 21/56; H01L 2924/3511; H01L 2924/3512; H01L 2924/35121

USPC .......................................................... 257/629
See application file for complete search history.

(56) References Cited

U.S. PATENT DOCUMENTS

2015/0116965 A1* 4/2015 Kim .................... H01L 23/5385
361/767
2018/0213647 A1* 7/2018 Gavagnin ............... H01L 24/19

FOREIGN PATENT DOCUMENTS

EP 3355666 8/2018

OTHER PUBLICATIONS

Search Report from European Patent Application No. 20162982.1, dated Aug. 26, 2020, 8 pgs.

* cited by examiner

*Primary Examiner* — Matthew E. Gordon
(74) *Attorney, Agent, or Firm* — Schwabe, Williamson & Wyatt, P.C.

(57) ABSTRACT

An integrated circuit package may be formed comprising a substrate that includes a mold material layer and a signal routing layer, wherein the mold material layer comprises at least one bridge and at least one foam structure embedded in a mold material. In one embodiment, the substrate may include the mold material of the mold material layer filling at least a portion of cells within the foam structure. In a further embodiment, at least two integrated circuit devices may be attached to the substrate, such that the bridge provides device-to-device interconnection between the at least two integrated circuit devices. In a further embodiment, the integrated circuit package may be electrically attached to an electronic board.

21 Claims, 6 Drawing Sheets

MULTI-PACKAGE ASSEMBLIES HAVING FOAM STRUCTURES FOR WARPAGE CONTROL

TECHNICAL FIELD

Embodiments of the present description generally relate to the field of integrated circuit package fabrication, and, more specifically, to an integrated circuit assembly including a substrate having a bridge for electrical signal connection between integrated circuit devices, wherein the bridge is embedded in a mold material layer, and wherein the substrate includes a foam material within the mold material layer for warpage control.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multi integrated circuit devices, such as microelectronic dice, have been developed. These multiple integrated circuit device packages are referred to in the art as multi-device or multi-chip packages (MCPs) and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

To address interconnection concerns, a bridge may be embedded in a substrate to which the integrated circuit devices are attached. These bridges support dense integrated circuit device-to-integrated circuit device interconnects, such as from a first integrated circuit device edge to a second integrated circuit device edge, and may support a number of signal lines through the bridge itself. The bridge itself may be an active device, such as another integrated device. Thus, a resulting integrated circuit package may be considerably smaller than an integrated circuit package that is only interconnected with conductive routes within the substrate. One approach to forming an embedded bridge is to form a mold material layer as a part of the substrate, wherein the bridge is embedded in the mold material layer. Additionally, conductive vias may be formed through the mold material layer to form additional electrical communication routes, as will be discussed. As will be understood, the fabrication of the mold material layer having the embedded bridge and the conductive vias will require the use of a rigid carrier, such as a glass carrier, which will allow for processes, such as grinding, to achieve low total thickness variation in order to meet stringent via-to-pad overlay requirements. For example, achieving a low total thickness variation of less than about 10 microns to meet a via-to-pad overlay of average of +4 sigma, e.g. less than about 4 microns, for fine pitch scaling up to 2/2 microns line/space, as will be understood to those skilled in the art.

In another approach, all of the bridges may be combined into a composite high bridge count patch, which is fabricated through a rigid carrier process by taking advantage of total thickness variation and bump thickness variation control. The integrated circuit device may be assembled on the high bridge count patch to form a 3D package through chip-on-wafer or chip-on-panel bonding, as known in the art. The 3D package may then be attached to a typical organic substrate to form a final package.

As will be understood, the integrated circuit packages will include materials with various thicknesses and coefficients of thermal expansion (CTE), particularly with regard to the integrated circuit devices, the mold material layers, and even the rigid carrier used to form the integrated circuit packages. A large CTE mismatch between the materials may result in unit level and/or panel level warpage. Another warpage issue is the warpage of the bridge which may result after releasing the integrated circuit package from the rigid carrier.

One technique to reduce warpage includes reformulating the mold material layer to provide adequate mechanical support with high modulus materials. However, this requires compromises across different properties, as high modulus materials normally possess branched or highly aromatic ring structures which have a risk for high viscosity and thus low moldability, processability, and/or manufacturability, and may itself increase panel warpage, which is a handling risk for downstream processes. A technique to reduce panel warpage is to increase the thickness of the rigid carrier, but it will not release internal stress, which causes warpage upon release from the rigid carrier. A further technique to reduce warpage is to attach a stiffener or use dummy silicon integrated circuit devices. However, this requires additional process steps and increases the cost of the integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
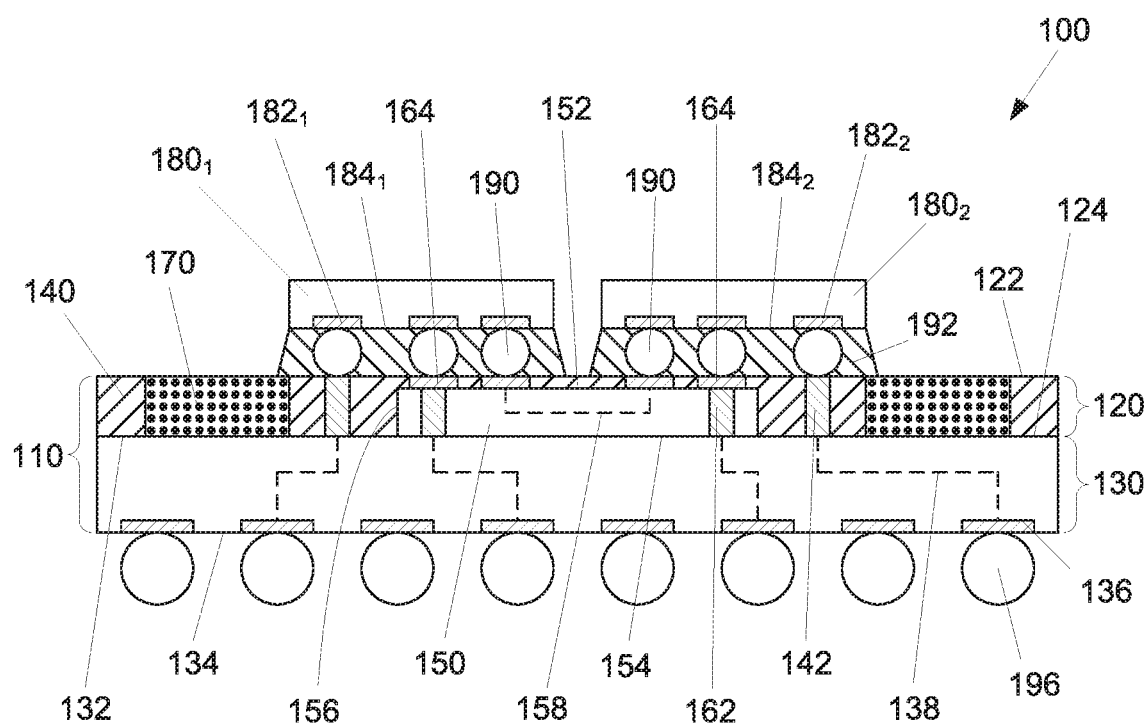
FIG. 1 is a side cross-sectional view of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package comprising a substrate that includes a mold material layer and a signal routing layer, wherein the mold material layer comprises at least one bridge and at least one foam structure embedded in a mold material. In one embodiment, the substrate may include the mold material of the mold material layer filling at least a portion of cells within the foam structure. In a further embodiment, at least two integrated circuit devices may be attached to the substrate, such that the bridge provides device-to-device interconnection between the at least two integrated circuit devices. In a further embodiment, the integrated circuit package may be electrically attached to an electronic board.

As shown in FIG. 1, an integrated circuit package 100 may be formed by first forming an electronic substrate 110. The electronic substrate 110 may comprise a mold material layer 120, having a first surface 122 and an opposing second surface 124, and a signal routing layer 130, having a first surface 132 and an opposing second surface 134. In one embodiment, the first surface 132 of the signal routing layer 130 abuts the second surface 124 of the mold material layer 120. The mold material layer 120 may comprise a mold material 140 having at least one bridge 150 and at least one foam structure 170 embedded therein. In one embodiment, the mold material layer 120 may further include at least one through-mold conductive via 142 extending from the first surface 122 of the mold material layer 120 to the second surface 124 of the mold material layer 120.

As illustrated, the at least one bridge 150 may include a first surface 152, an opposing second surface 154, and at least one side 156 extending between the first surface 152 and the second surface 154. The bridge 150 may include at least one device-to-device interconnection route 158 (illustrated as a dashed line) and may include a plurality of through-bridge conductive vias 162, wherein each of the plurality of through-bridge conductive vias 162 extends between the first surface 152 of the bridge 150 and the second surface 154 of the bridge 150. In one embodiment, the mold material 140 may contact at least a portion of the side 156 of the bridge 150. In one embodiment, the bridge 150 may comprise silicon-containing components. As will be understood to those skilled in the art, silicon bridges may be preferred because silicon processing technology is relatively advanced, and interconnect pitches and line widths for the device-to-device interconnection route 158 that are achievable using existing silicon process technology may be significantly smaller, and thus more dense, than what is possible using, for example, currently available technology for copper signal lines in polymer layers, as is common in substrate fabrication.

As further shown in FIG. 1, a plurality of integrated circuit devices (illustrated as a first integrated circuit device $180_1$ and a second integrated circuit device $180_2$) may be electrically attached to the electronic substrate 110. The first integrated circuit device $180_1$ and the second integrated circuit device $180_2$ (as well as any further integrated circuit devices that may be utilized) may be any appropriate device, including, but not limited to, a microprocessor, a chipset, a graphics device, a wireless device, a memory device, an application specific integrated circuit device, combinations thereof stacks thereof, and the like. The first integrated circuit device $180_1$ and the second integrated circuit device $180_2$ may be attached to the electronic substrate 110 through a plurality of device-to-substrate interconnects 190, such as reflowable solder bumps or balls, in a configuration generally known as a flip-chip or controlled collapse chip connection ("C4") configuration. The device-to-substrate interconnects 190 may extend between bond pads $182_1$ on a first surface $184_1$ of the first integrated circuit device $180_1$ and corresponding through-mold conductive vias 142, and between the first integrated circuit device bond pads $182_1$ and corresponding bond pads 164 on a first surface 152 of the bridge 150 to form electrical connections therebetween. The device-to-substrate interconnects 190 may also extend between bond pads $182_2$ on a first surface $184_2$ of the second integrated circuit device $180_2$ and corresponding through-mold conductive vias 142, and between the second integrated device bond pads $182_2$ and corresponding bridge bond pads 164 to form an electrical connection therebetween. It is understood that the first integrated circuit device bond pads $182_1$ may be in electrical communication with integrated circuitry (not shown) within the first integrated circuit device $180_1$, and that the second integrated circuit device bond pads $182_2$ may be in electrical communication with integrated circuitry (not shown) within the second integrated circuit device $180_2$. The bridge 150 may create an electrical signal connection between the first integrated circuit device $180_1$ and the second integrated circuit device $180_2$ with the at least one device-to-device interconnection route 158 extending between one bond pad 164 of the bridge 150 that is electrically connected to the first integrated circuit device $180_1$ and another bond pad 164 of the bridge 150 that is electrically connected to the second integrated circuit device $180_2$. In an embodiment, the bridge 150 may be a microprocessor, and the first integrated circuit device $180_1$ and the second integrated circuit device $180_2$ may each be a memory device.

The device-to-substrate interconnects 190 may be any appropriate electrically conductive material or structure, including but not limited to, solder balls, metal bumps or pillars, metal filled epoxies, or a combination thereof. In one embodiment, the device-to-substrate interconnects 190 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 190 may be copper bumps or pillars. In a further embodiment, the device-to-substrate interconnects 190 may be metal bumps or pillars coated with a solder material.

In one embodiment, an underfill material 192, such as an epoxy material, may be disposed between the electronic substrate 110 and the integrated circuit devices 180₁ and 180₂, and surrounding the plurality of device-to-substrate interconnects 190. As will be understood to those skilled in the art, the underfill material 192 may be dispensed between the first surfaces 182₁, 182₂ of the integrated circuit devices 180₁, 180₂, respectively, and the electronic substrate 110 as a viscous liquid and then hardened with a curing process. The underfill material 192 may also be a molded underfill material. The underfill material 192 may provide structural integrity and may prevent contamination, as will be understood to those skilled in the art.

As previously discussed, the electronic substrate 110 includes the signal routing layer 130, which includes a plurality of conductive routes 138 (illustrated as dashed lines) which are electrically connected to the through-mold conductive vias 142 and/or the through-bridge conductive vias 162 at the first surface 132 of the signal routing layer 130, and extend though the signal routing layer 130 to substrate-to-board bond pads 136 on the second surface 134 of the signal routing layer 130. External interconnects 196, such as solder balls, may be attached to the substrate-to-board pond pads 136. The signal routing layer 130 may comprise a plurality of dielectric material layers (not shown in FIG. 1), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, as well as laminates or multiple layers thereof, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes 138 may be a combination of conductive traces (not shown) and conductive vias (not shown) that extend through the plurality of dielectric material layers (not shown). The conductive traces and the conductive vias may be made of any appropriate conductive material, including, but not limited to, metals, such as copper, silver, nickel, gold, and aluminum, alloys thereof, and the like. These conductive traces and conductive vias, and processes of forming the same, are well known in the art and are not shown in FIG. 1 for purposes of clarity.

Figure 2:
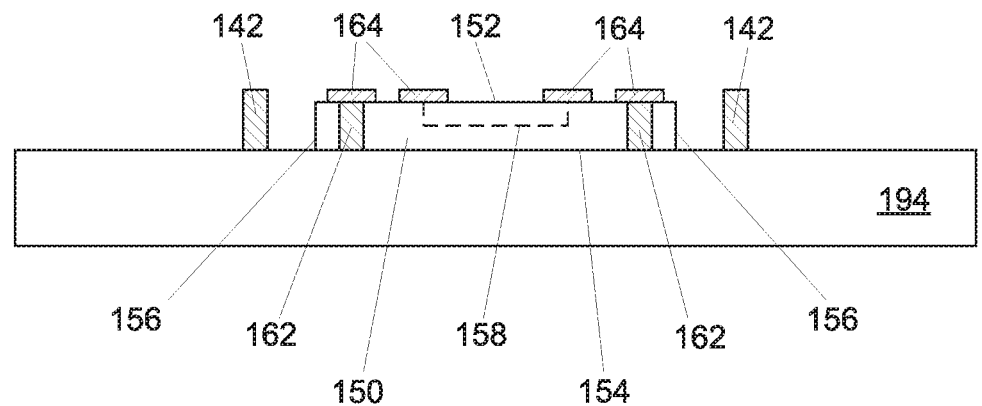
FIGS. 2-4 are side cross-sectional views of a process for fabrication an integrated circuit package, according to an embodiment of the present description.
Figure 3:
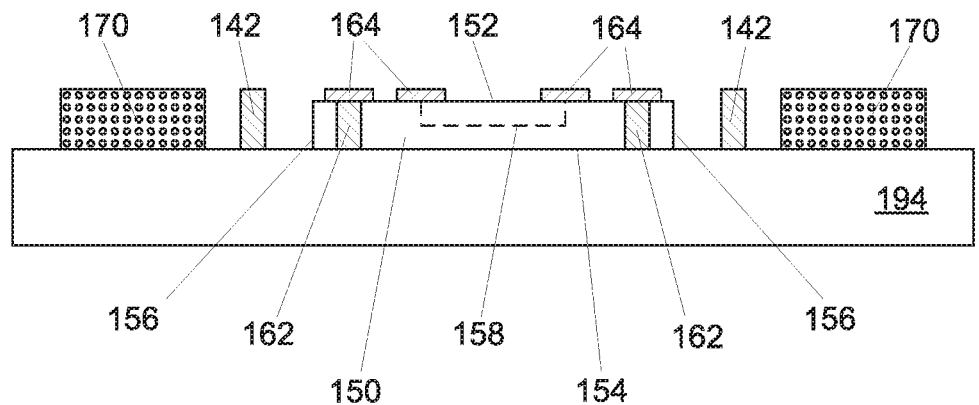
Figure 4:
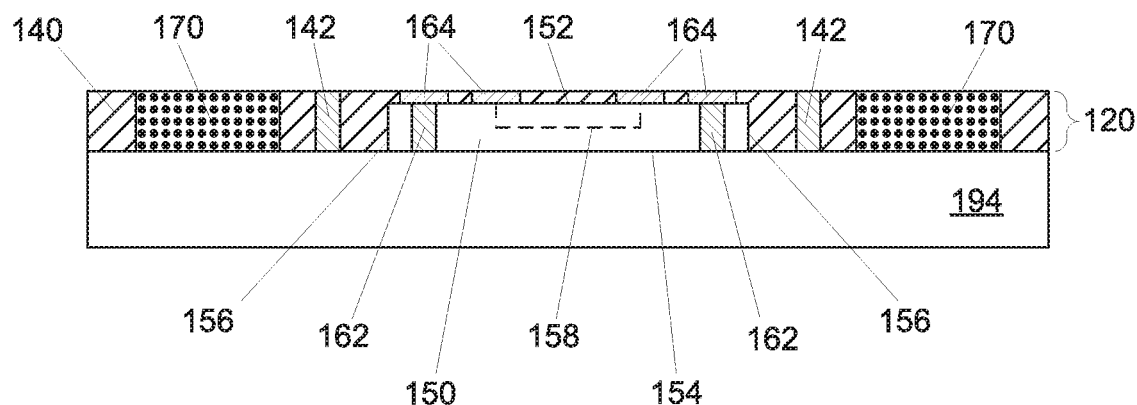

As previously discussed, the mold material layer 120 has the foam structure 170 formed therein to abate warpage. As shown in FIGS. 2-4, the foam structure 170 may be incorporated during the fabrication of the mold material layer 120. As shown in FIG. 2, the at least one through-mold conductive via 142 may be formed on a rigid carrier 194 followed by the attachment of the bridge 150. As shown in FIG. 3, the at least one foam structure 170 may be attached to the rigid carrier 194. As shown in FIG. 4, the mold material 140 may be introduced to encapsulate the bridge 150, the at least one through-mold conductive via 142, and the at least one foam structure 170, thereby forming the mold material layer 120. It is understood that other structures, such as bond pads, solder resist layers, and the like, may be formed on the rigid carrier 194 prior to the formation of the through-mold conductive vias 142 and the attachment of the bridge 150. As will be understood to those skilled in the art, additional processing steps are involved, such as lithographic processes, planarizations, depositions, etchings, and the like, in the fabrication of the mold material layer 120 that are not shown, and that FIGS. 2-4 are merely intermediate stages.

Figure 5:
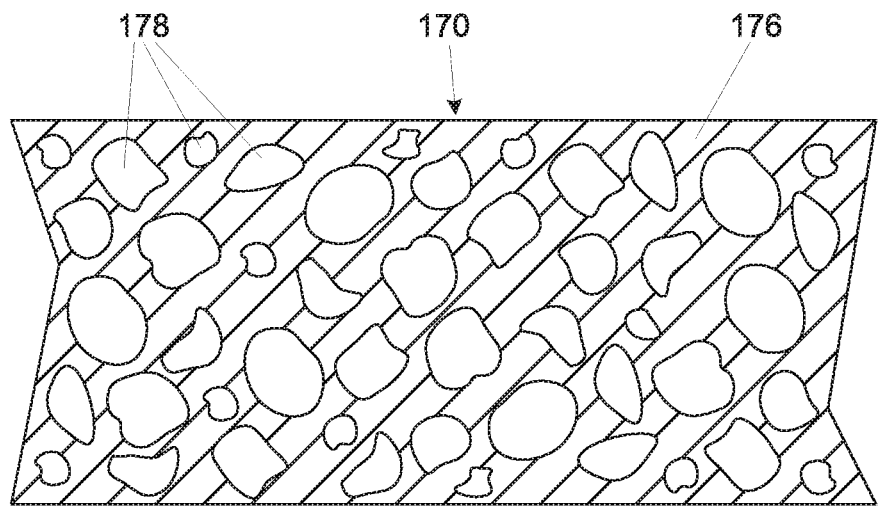
FIGS. 5 and 6 are side cross-sectional views of the incorporation of a mold material into cells within a matrix structure of a foam structure, according to one embodiment of the present description.
Figure 6:
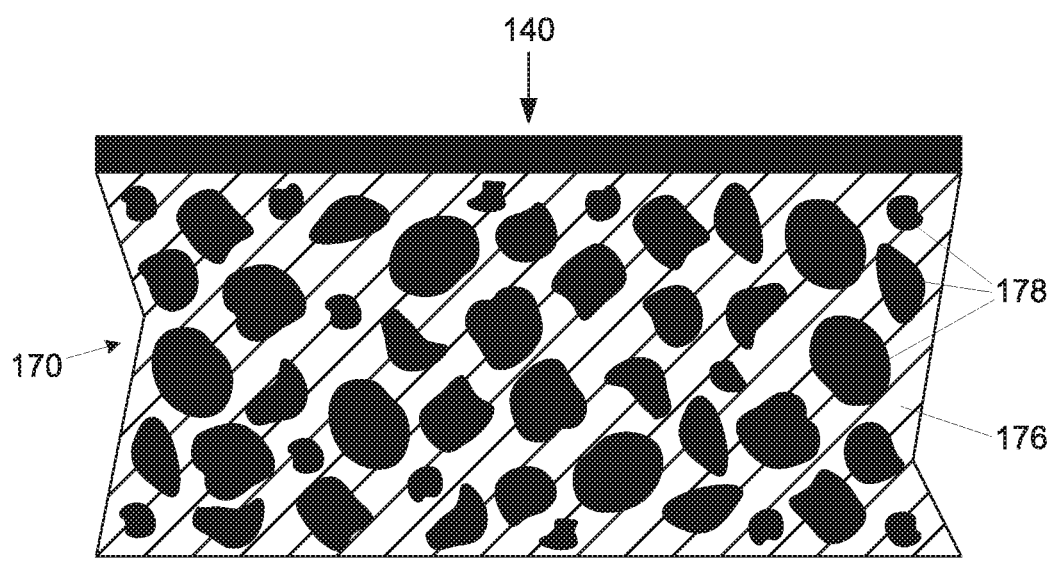

FIGS. 5 and 6 illustrate the introduction of the old material 140 specifically to the at least one foam structure 170, as illustrated in FIG. 4. As shown in FIG. 5, the foam structure 170 may comprise a matrix structure 176 having a plurality of cells 178 dispersed therein. The foam structure 170 may be either an open cell or a closed cell foam. An open cell foam is defined to be a foam wherein a portion of the cells are open to other cells and/or the outside atmosphere. A closed cell foam is defined to be a foam the cells are enclosed by their own wall and do not interconnect with other cells in the foam. In one embodiment, as shown in FIG. 6, the plurality of cells 178 of the foam structure 170 may be an open cell structure, such that the mold material 140 flows into at least one cell of the plurality of cells 178. The mold material 140 may include any appropriate dielectric material, including but not limited to, a typical mold material, build-up films, solder resists, and the like. In an embodiment, the typical mold material may, comprise epoxy, silica fillers, hardeners, silicone, and the like. In a further embodiment, the build-up films may comprise epoxy resin combined with phenolic, phenolic ester, or cyanate ester hardeners, and the like.

In an embodiment of the present description, the matrix structure 176 of the foam structure 170 may comprise silica, alumina, magnesia, calcium oxide, and the like. The foam structure 170 may have the plurality of cells 178 comprising between about 75% and 95% of the volume of the foam structure 170, and may have a density of about 2330 kg/m³ (kilograms per cubic meter). Considering that typical mold materials 140, such as epoxy materials, may have a coefficient of thermal expansion ("CTE") of about 15 ppm/K (parts per million per degree Kelvin). The incorporation of the foam structure 170 may result in the mold material layer 120 having a reduced coefficient of thermal expansion as shown in the table below, which is a list of output CTEs with differing silica foam porosities.

| Porosity (volume % of molding compound) | Composite Coefficient of Thermal Expansion (ppm/K) | Effective CTE of an isotropic 2-phase composite of arbitrary microstructure |
|---|---|---|
| 30% | 1.43 | $\alpha = \dfrac{c_1 \alpha_1 K_1 + c_2 \alpha_2 K_2}{c_1 K_1 + c_2 K_2}$ |
| 50% | 2.44 | |
| 70% | 4.3 | |
| 80% | 5.98 | $c_1$ and $c_2$ are volume fractions of the 2 phases |
| 99% | 14.09 | $K_1$ and $K_2$ are bulk moduli $\alpha_1$ and $\alpha_2$ are CTEs of the phases |

Additionally, mold materials are available having coefficients of thermal expansion of about 8 ppm/K, which in combination with a foam structure 170 having a porosity of about 75% may have a combined coefficient of thermal expansion of less than about 3 ppm/K. Therefore, as the coefficient of thermal expansion of the integrated circuit devices 180₁ and 180₂, and the bridge 150 may be about 2.6 ppm/K, the integrated circuit package 100 can be well balanced with regard to coefficient of thermal expansion, and, thus, no internal mechanical stress, thereby, providing warpage control advantages.

Figure 7:
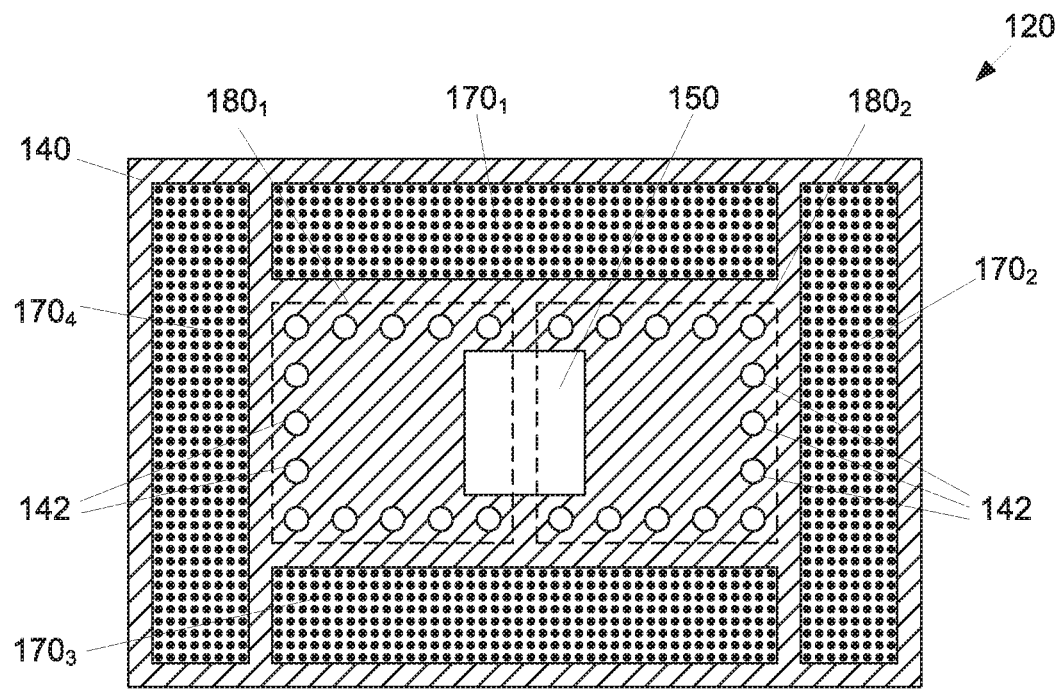
FIGS. 7 and 8 are top cross-sectional views of bridge and foam structures layouts for a mold material layer, according to various embodiments of the present description.
Figure 8:
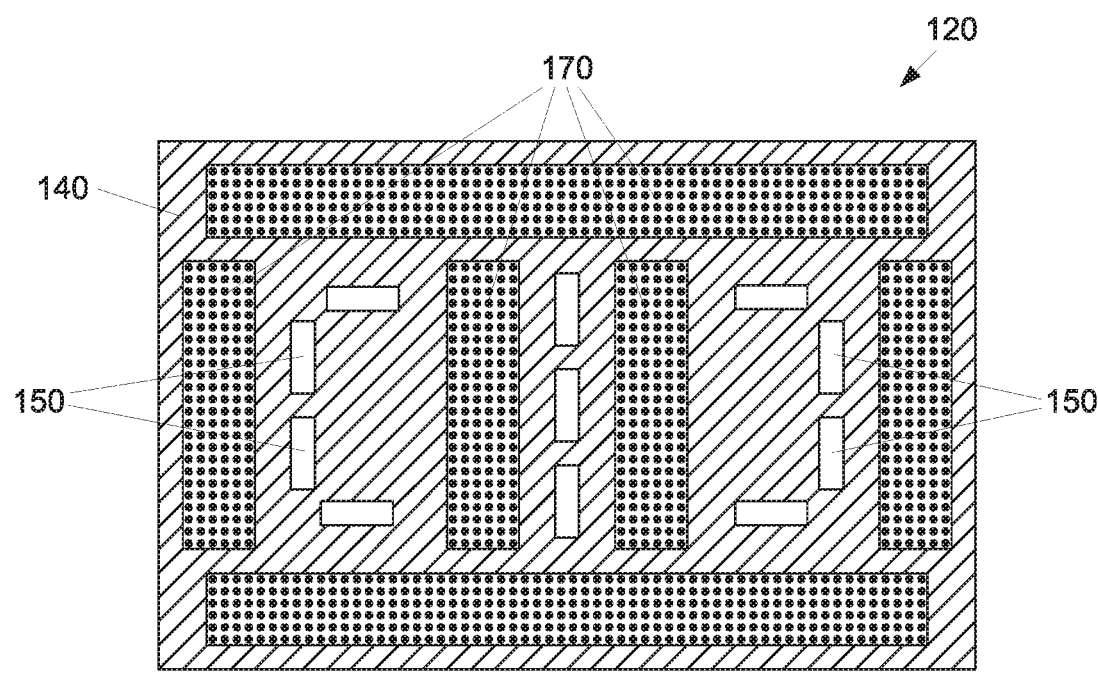

It is understood that not only may the materials and properties of the foam structure 170 may be adjusted to achieve an overall coefficient of thermal expansion for the integrated circuit package 100, the foam structure 170 may be positioned as needed to alleviate warpage. FIG. 7 illustrates a cross-sectional top view of the mold material layer 120, wherein a plurality of foam structures (illustrated as elements $170_1$, $170_2$, $170_3$, and $170_4$) substantially surrounding the bridge 150 and the through-mold conductive vias 142 (the first integrated circuit device $180_1$ and the second integrated circuit device $180_2$ are shown in dashed line for clarity). It is understood, as shown in FIG. 8, which is also a cross-sectional top view of the mold material layer 120, the foam structure 170 and the bridges 150 may have complex arrangements. In various embodiments of the present description, the foam structure(s) 170 may comprise any appropriate percentage of the mold material layer 120. In one embodiment, the foam structure(s) 170 may comprise between about 10% and 80% of the mold material layer 120. In another embodiment, the foam structure(s) 170 may comprise between about 10% and 35% of the mold material layer 120. In yet another embodiment, the foam structure(s) 170 may comprise greater than 50% of the mold material layer 120.

Figure 9:
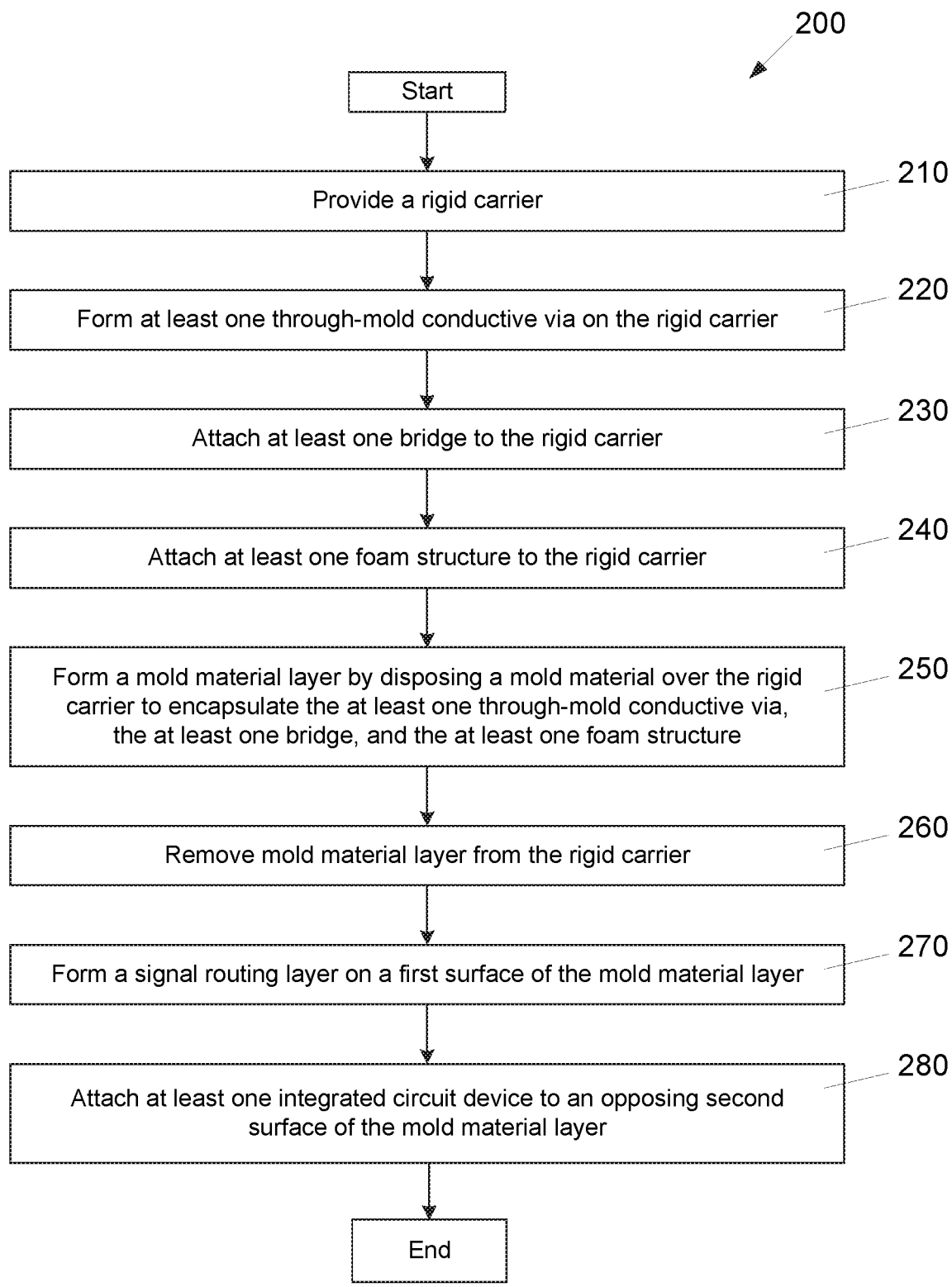
FIG. 9 is a flow chart of a process of fabricating an integrated circuit package, according to an embodiment of the present description.

FIG. 9 is a flow chart of a process 200 of fabricating an integrated circuit package according to an embodiment of the present description. As set forth in block 210, a rigid carrier may be provided. At least one through-mold conductive via may be formed on the rigid carrier, as set forth in block 220. As set forth in block 230, at least one bridge may be attached to the rigid carrier. At least one foam structure may be attached to the rigid carrier, as set forth in block 240. As set forth in block 250, a mold material layer may be formed by disposing a mold material over the rigid carrier to encapsulate the at least one through-mold conductive via, the at least one bridge, and the at least one foam structure. The mold material layer may be removed from the rigid carrier, as set forth in block 260. As set forth in block 270, a signal routing layer may be formed on a first surface of the mold material layer. At least one integrated circuit device may be attached to an opposing second surface of the mold material layer, as set forth in block 280.

Figure 10:
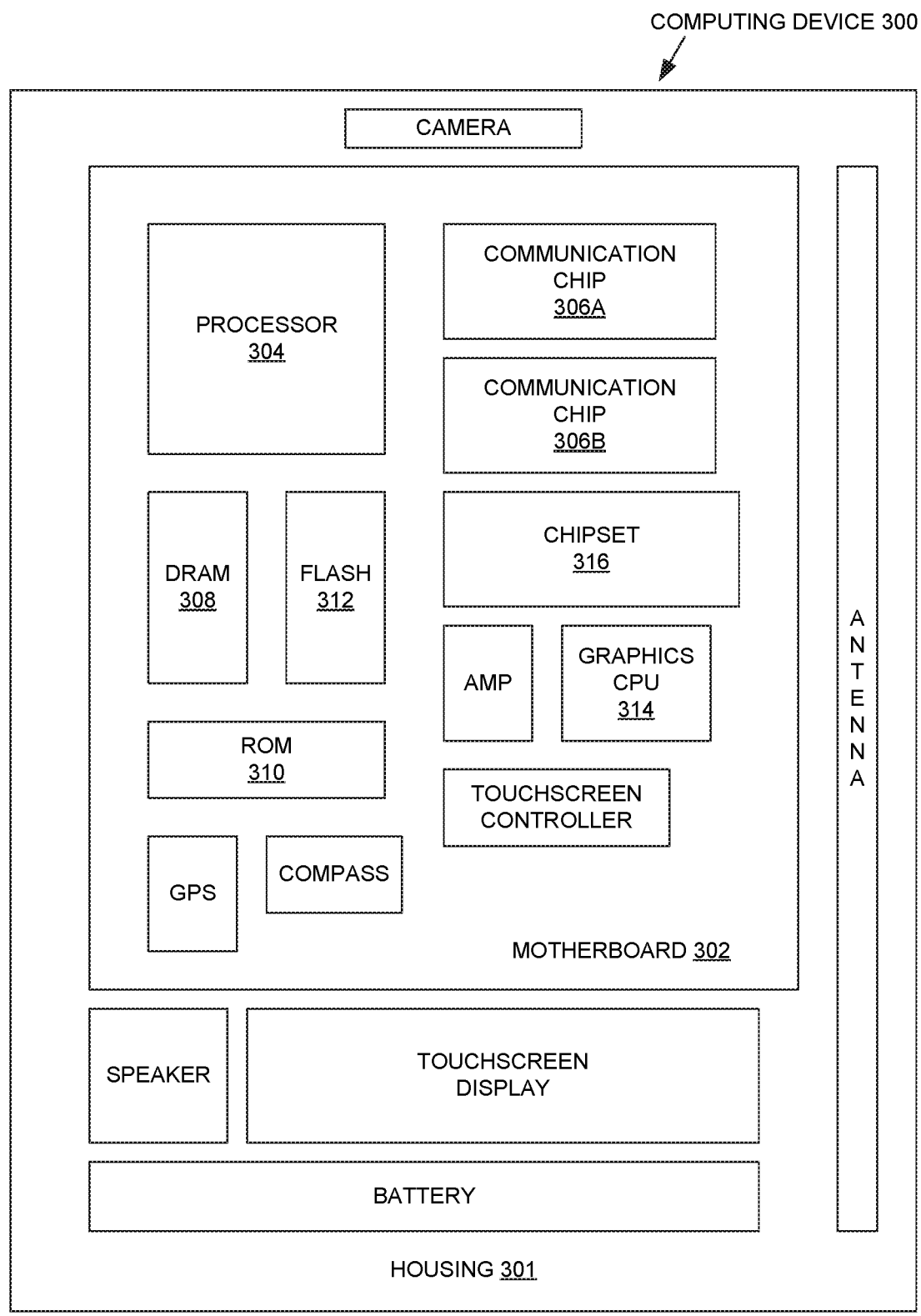
FIG. 10 is an electronic system, according to one embodiment of the present description.

FIG. 10 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising an electronic substrate comprising a mold material layer, wherein the mold material layer comprises a mold material having at least one bridge and at least one foam structure embedded therein; and a signal routing layer attached to the mold material layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-10. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an electronic substrate comprising a mold material layer, wherein the mold material layer comprises a mold material having at least one bridge and at least one foam structure embedded therein; and a signal routing layer attached to the mold material layer.

In Example 2, the subject matter of Example 1 can optionally include at least one through-mold conductive via extending from a first surface of the mold material layer to an opposing second surface of the mold material layer.

In Example 3, the subject matter of any of Examples 1 to 2 can optionally include the foam structure comprising a matrix structure having a plurality of cells dispersed therein.

In Example 4, the subject matter of Example 3 can optionally include at least a portion of the mold material being dispersed within at least a portion of the plurality of cells.

In Example 5, the subject matter of any of Examples 1 to 4 can optionally include the bridge including at least one interconnection route.

In Example 6, the subject matter of any of Examples 1 to 5 can optionally include the bridge including at least one through-bridge conductive via.

Example 7 is an integrated circuit package comprising an electronic substrate comprising a mold material layer, wherein the mold material layer comprises a mold material having at least one bridge and at least one foam structure embedded therein, and a signal routing layer attached to the mold material layer; and at least one integrated circuit device electrically attached to the electronic substrate.

In Example 8, the subject matter of Example 7 can optionally include at least one through-mold conductive via extending from a first surface of the mold material layer to an opposing second surface of the mold material layer.

In Example 9, the subject matter of Example 8 can optionally include the at least one integrated circuit device being electrically connected to the at least one bridge and the at least one through-mold conductive via.

In Example 10, the subject matter of any of Examples 7 to 9 can optionally include the bridge including at least one interconnection route.

In Example 11, the subject matter of any of Examples 7 to 10 can optionally include the bridge including at least one through-bridge conductive via.

In Example 12, the subject matter of any of Examples 7 to 11 can optionally include the foam structure comprising a matrix structure having a plurality of cells dispersed therein.

In Example 13, the subject matter of Example 12 can optionally include at least a portion of the mold material being dispersed within at least a portion of the plurality of cells.

Example 14 is an electronic system, comprising a board and an integrated circuit package electrically attached to the board, wherein the integrated circuit package comprises an integrated circuit package comprising an electronic substrate comprising a mold material layer, wherein the mold material layer comprises a mold material having at least one bridge and at least one foam structure embedded therein, and a signal routing layer attached to the mold material layer; and at least one integrated circuit device electrically attached to the electronic substrate.

In Example 15, the subject matter of Example 14 can optionally include at least one through-mold conductive via extending from a first surface of the mold material layer to an opposing second surface of the mold material layer.

In Example 16, the subject matter of Example 15 can optionally include the at least one integrated circuit device being electrically connected to the at least one bridge and the at least one through-mold conductive via.

In Example 17, the subject matter of any of Examples 14 to 16 can optionally include the bridge including at least one interconnection route.

In Example 18, the subject matter of any of Examples 14 to 17 can optionally include the bridge including at least one through-bridge conductive via.

In Example 19, the subject matter of any of Examples 14 to 18 can optionally include the foam structure comprising a matrix structure having a plurality of cells dispersed therein.

In Example 20, the subject matter of Example 19 can optionally include at least a portion of the mold material being dispersed within at least a portion of the plurality of cells.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic substrate comprising:
   a mold material layer, wherein the mold material layer comprises a mold material having at least one bridge and at least one foam structure embedded therein, the at least one foam structure comprising a plurality of discrete linear segments around the at least one bridge; and
   a signal routing layer attached to the mold material layer.

2. The electronic substrate of claim 1, further comprising at least one through-mold conductive via extending from a first surface of the mold material layer to an opposing second surface of the mold material layer.

3. The electronic substrate of claim 1, wherein the at least one foam structure comprises a matrix structure having a plurality of cells dispersed therein.

4. The electronic substrate of claim 3, wherein at least a portion of the mold material is dispersed within at least a portion of the plurality of cells.

5. The electronic substrate of claim 1, wherein the at least one bridge includes at least one interconnection route.

6. The electronic substrate of claim 1, wherein the at least one bridge includes a through-bridge conductive via.

7. An integrated circuit package comprising:
   an electronic substrate, wherein the electronic substrate comprises a mold material layer, wherein the mold material layer comprises a mold material having at least one bridge and at least one foam structure embedded therein, the at least one foam structure comprising a plurality of discrete linear segments around the at least one bridge, and a signal routing layer attached to the mold material layer; and
   at least one integrated circuit device electrically attached to the electronic substrate.

8. The integrated circuit package of claim 7, further comprising at least one through-mold conductive via extending from a first surface of the mold material layer to an opposing second surface of the mold material layer.

9. The integrated circuit package of claim 8, wherein the at least one integrated circuit device is electrically connected to the at least one bridge and the at least one through-mold conductive via.

10. The integrated circuit package of claim 7, wherein the at least one bridge includes at least one interconnection route.

11. The integrated circuit package of claim 7, wherein the at least one bridge includes a through-bridge conductive via.

12. The integrated circuit package of claim 7, wherein the at least one foam structure comprises a matrix structure having a plurality of cells dispersed therein.

13. The integrated circuit package of claim 12, wherein a portion of the mold material is dispersed within at least a portion of the plurality of cells.

14. An electronic system comprising:
   a board; and
   an integrated circuit package electrically attached to the board, wherein the integrated circuit package comprises:
      an electronic substrate, wherein the electronic substrate comprises a mold material layer, wherein the mold material layer comprises a mold material having at least one bridge and at least one foam structure embedded therein, the at least one foam structure comprising a plurality of discrete linear segments around the at least one bridge, and a signal routing layer attached to the mold material layer; and at least one integrated circuit device electrically attached to the electronic substrate.

15. The electronic system of claim 14, further comprising at least one through-mold conductive via extending from a first surface of the mold material layer to an opposing second surface of the mold material layer.

16. The electronic system of claim 15, wherein the at least one integrated circuit device is electrically connected to the at least one bridge and the at least one through-mold conductive via.

17. The electronic system of claim 14, wherein the at least one bridge includes at least one interconnection route.

18. The electronic system of claim 14, wherein the at least one bridge includes a through-bridge conductive via.

19. The electronic system of claim 14, wherein the at least one foam structure comprises a matrix structure having a plurality of cells dispersed therein.

20. The electronic system of claim 19, wherein at least a portion of the mold material is dispersed within at least a portion of the plurality of cells.

21. An electronic substrate comprising:
a mold material layer, wherein the mold material layer comprises a mold material having at least one bridge and at least one foam structure embedded therein, wherein the at least one foam structure comprises a matrix structure having a plurality of cells dispersed therein, and, wherein at least a portion of the mold material is dispersed within at least a portion of the plurality of cells; and
a signal routing layer attached to the mold material layer.

* * * * *